United States Patent
Peng et al.

(10) Patent No.: US 9,837,310 B2
(45) Date of Patent: Dec. 5, 2017

(54) METHOD OF MANUFACTURING A SEMICONDUCTOR DEVICE

(71) Applicant: Taiwan Semiconductor Manufacturing Company, Ltd., Hsin-Chu (TW)

(72) Inventors: Chao-Hsien Peng, Zhubei (TW); Chi-Liang Kuo, Hsin-Chu (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 14/554,671

(22) Filed: Nov. 26, 2014

(65) Prior Publication Data

US 2015/0132947 A1    May 14, 2015

Related U.S. Application Data

(62) Division of application No. 13/834,448, filed on Mar. 15, 2013, now Pat. No. 8,916,469.

(Continued)

(51) Int. Cl.
*H01L 21/47* (2006.01)
*H01L 21/31* (2006.01)
(Continued)

(52) U.S. Cl.
CPC .. *H01L 21/76879* (2013.01); *H01L 21/76823* (2013.01); *H01L 21/76829* (2013.01); *H01L 21/76831* (2013.01); *H01L 21/76841* (2013.01); *H01L 21/76843* (2013.01); *H01L 21/76862* (2013.01); *H01L 21/76867* (2013.01); *H01L 21/76874* (2013.01); *H01L 21/76883* (2013.01); *H01L 23/5226* (2013.01); *H01L 23/53238* (2013.01); *H01L 23/53233* (2013.01); *H01L 2924/0002* (2013.01)

(58) Field of Classification Search
CPC ..... H01L 21/4763; H01L 21/44; H01L 21/28; H01L 29/40; H01L 23/48; H01L 23/52
USPC ....... 438/643–653, 622, 624, 627, 687, 703, 438/598, 618, 608, 633, 634; 257/753, 257/751, 738, 774, 763, 758, 737, 4, 257/E45.002, E21.58, E21.169, E21.226, 257/E21.158, E21.579, E21.577, E23.14, 257/E21.252, E23.011, E21.168, E21.576, 257/E21.495, E21.57, E23.021
See application file for complete search history.

(56) References Cited

U.S. PATENT DOCUMENTS 6,589,711 B1    7/2003 Subramanian et al.
6,686,278 B2 *  2/2004 Wang ................ H01L 21/28562
                                                  257/E21.171
(Continued)

*Primary Examiner* — Sheikh Maruf
(74) *Attorney, Agent, or Firm* — Slater Matsil, LLP

(57) ABSTRACT

A method of manufacturing a semiconductor device may include: forming an opening in a dielectric layer, the opening exposing a non-conductive layer disposed over a semiconductor substrate; forming a self-assembled monolayer (SAM) within the opening and over the non-conductive layer; forming a catalytic layer within the opening and over the SAM; filling the opening having the SAM and the catalytic layer with a conductive material to form a plug; and forming a barrier layer on sidewalls of the plug.

20 Claims, 7 Drawing Sheets

Related U.S. Application Data

(60) Provisional application No. 61/777,689, filed on Mar. 12, 2013.

(51) Int. Cl.
*H01L 21/44* (2006.01)
*H01L 21/768* (2006.01)
*H01L 23/522* (2006.01)
*H01L 23/532* (2006.01)

(56) References Cited

U.S. PATENT DOCUMENTS

| | | | |
|---|---|---|---|
| 7,648,899 B1* | 1/2010 | Banerji | C23C 16/0227 257/E21.575 |
| 2002/0001952 A1* | 1/2002 | Chooi | H01L 21/76801 438/687 |
| 2002/0168807 A1* | 11/2002 | Seki | B82Y 30/00 438/156 |
| 2003/0077897 A1 | 4/2003 | Tsai et al. | |
| 2004/0142561 A1 | 7/2004 | Wu et al. | |
| 2005/0009339 A1* | 1/2005 | Park | H01L 21/76877 438/687 |
| 2005/0048768 A1* | 3/2005 | Inoue | H01L 21/288 438/629 |
| 2005/0095828 A1* | 5/2005 | Schmidt | H01L 21/02118 438/584 |
| 2005/0110149 A1* | 5/2005 | Osaka | H01L 21/76801 257/758 |
| 2005/0124154 A1* | 6/2005 | Park | H01L 21/28562 438/643 |
| 2005/0153544 A1 | 7/2005 | Suh et al. | |
| 2005/0161821 A1* | 7/2005 | Lee | H01L 21/76801 257/758 |
| 2005/0164487 A1 | 7/2005 | Seutter et al. | |
| 2006/0003438 A1* | 1/2006 | Engstrom | B05D 1/185 435/287.2 |
| 2006/0108320 A1* | 5/2006 | Lazovsky | B82Y 30/00 216/2 |
| 2006/0113675 A1 | 6/2006 | Chang et al. | |
| 2006/0121733 A1* | 6/2006 | Kilpela | C23C 16/18 438/681 |
| 2007/0026669 A1* | 2/2007 | Tsumura | H01L 21/76807 438/637 |
| 2007/0099422 A1* | 5/2007 | Wijekoon | C23C 18/165 438/687 |
| 2008/0057198 A1* | 3/2008 | Yoon | H01L 21/0206 427/250 |
| 2008/0113506 A1* | 5/2008 | Ohtsuka | H01L 21/76814 438/653 |
| 2008/0146015 A1* | 6/2008 | Usui | H01L 21/76831 438/608 |
| 2008/0251921 A1 | 10/2008 | Besling | |
| 2009/0286394 A1* | 11/2009 | Ko | H01L 21/76825 438/666 |
| 2010/0052080 A1* | 3/2010 | Garcia Tello | G01N 27/3278 257/414 |
| 2010/0068880 A1* | 3/2010 | Hatanaka | C23C 16/30 438/627 |
| 2010/0155687 A1* | 6/2010 | Reyes | H01L 45/04 257/4 |
| 2011/0006425 A1* | 1/2011 | Wada | H01L 21/76807 257/750 |
| 2011/0084320 A1* | 4/2011 | Jung | H01L 21/28512 257/288 |
| 2011/0223762 A1* | 9/2011 | Yu | H01L 21/76849 438/653 |
| 2012/0037877 A1* | 2/2012 | Breitwisch | H01L 45/06 257/3 |
| 2012/0149168 A1 | 6/2012 | Helneder et al. | |
| 2012/0211890 A1* | 8/2012 | Azumo | C23C 16/14 257/751 |
| 2012/0269987 A1* | 10/2012 | Dordi | H01L 21/0206 427/539 |
| 2013/0154087 A1* | 6/2013 | Yoshimizu | C23C 18/1608 257/734 |
| 2013/0230986 A1* | 9/2013 | Rajagopalan | C23C 16/325 438/682 |
| 2014/0106561 A1* | 4/2014 | Niyogi | C23C 14/042 438/643 |
| 2014/0225263 A1* | 8/2014 | Nemoto | H01L 23/53238 257/751 |

\* cited by examiner

METHOD OF MANUFACTURING A SEMICONDUCTOR DEVICE

PRIORITY CLAIM AND CROSS-REFERENCE

This application is a divisional of U.S. patent application Ser. No. 13/834,448, entitled "Method of Fabricating Copper Damascene," filed on Mar. 15, 2013, which application claims the benefit of U.S. Provisional Application Ser. No. 61/777,689, filed on Mar. 12, 2013, entitled "Method of Fabricating Copper Damascene," which applications are hereby incorporated herein by reference.

BACKGROUND

In semiconductor technology, an integrated circuit can be formed on a semiconductor substrate according to a particular technology node, which typically indicates a minimum feature size. When the minimum feature size moves to about 100 nm or below, damascene processes are frequently utilized to form multilayer copper interconnections including vertical interconnection vias and horizontal interconnection metal lines. As semiconductor device sizes continue to shrink, the damascene process will see a number of potential problems that may affect the quality of the interconnections. For example, in a 20-namometer (nm) fabrication process, the openings may become too narrow and thus may not be properly filled by conventional damascene processes. The top portion of the opening may be blocked, which may create a void underneath that may degrade the performance of the semiconductor device. This problem is particularly acute in high aspect ratio features of small width.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
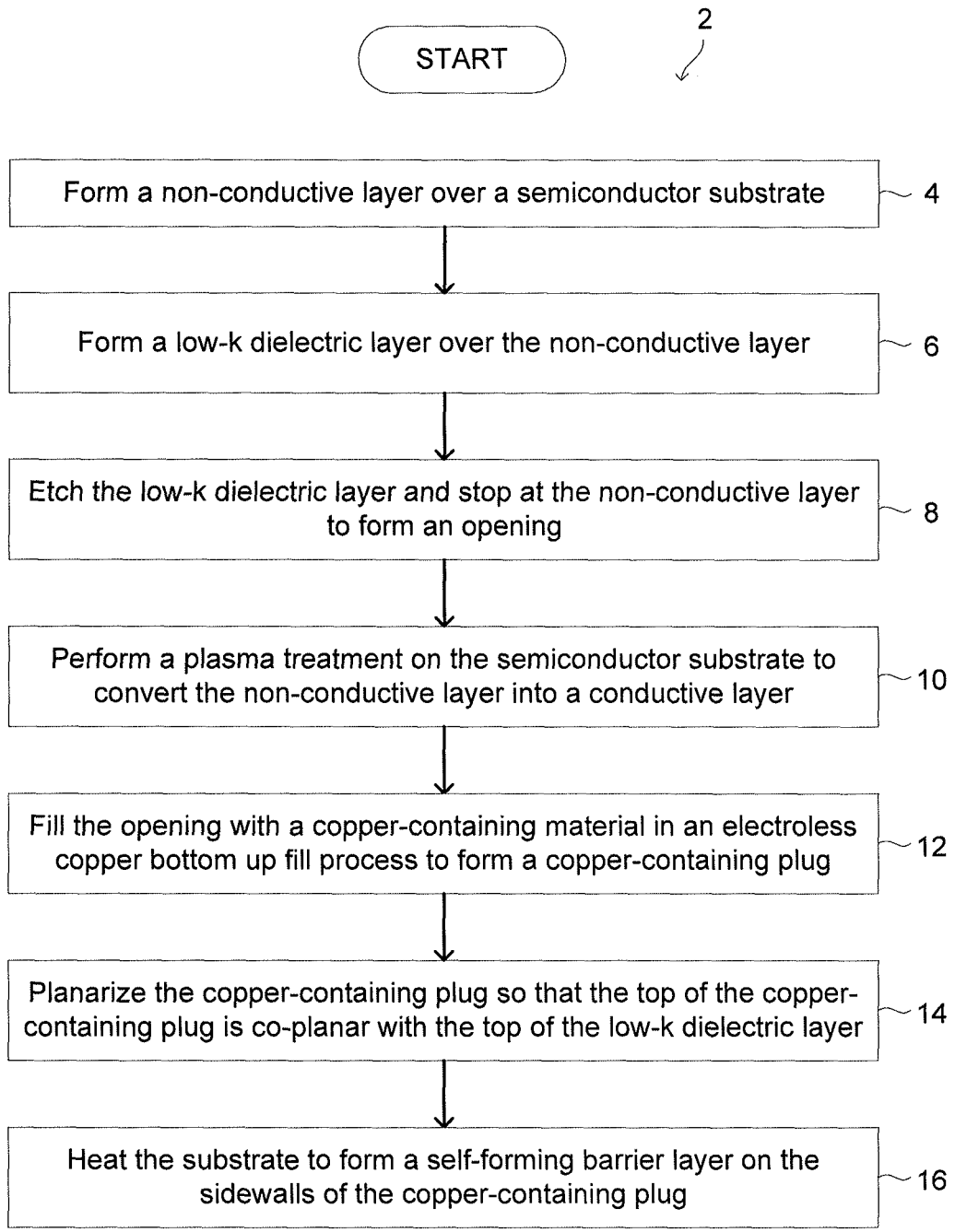
FIG. 1 is a flowchart of a method of fabricating a semiconductor device according to one embodiment of the present disclosure.

FIG. 1 is a flowchart of a method 2 for fabricating a semiconductor device according to various aspects of the present disclosure. Referring to FIG. 1, the method 2 includes block 4, in which a non-conductive layer is formed over a semiconductor substrate. The method 2 includes block 6, in which a low-k dielectric layer is formed over the non-conductive layer. The method 2 includes block 8, in which the low-k dielectric layer is etched and the etching stopping at the non-conductive layer to form an opening. The method 2 includes block 10, in which a plasma treatment is performed on the semiconductor substrate to convert the non-conductive layer into a conductive layer. The method 2 includes block 12, in which the opening is filled with a copper-containing material in an electroless copper bottom up fill process to form a copper-containing plug. The method 2 includes block 14, in which the copper-containing plug is planarized so that the top of the copper-containing plug is co-planar with the top of the low-k dielectric layer. The method 2 includes block 16, in which the semiconductor substrate is heated to form a self-forming barrier layer on the sidewalls of the copper-containing plug.

It is understood that additional processes may be performed before, during, or after the blocks 4-16 shown in FIG. 1 to complete the fabrication of the semiconductor device, but these additional processes are not discussed herein in detail for the sake of simplicity.

FIGS. 2-7 are diagrammatic fragmentary cross-sectional side views of a semiconductor device at various fabrication stages according to one embodiment of the method 2 of FIG. 1. It is understood that FIGS. 2-12 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
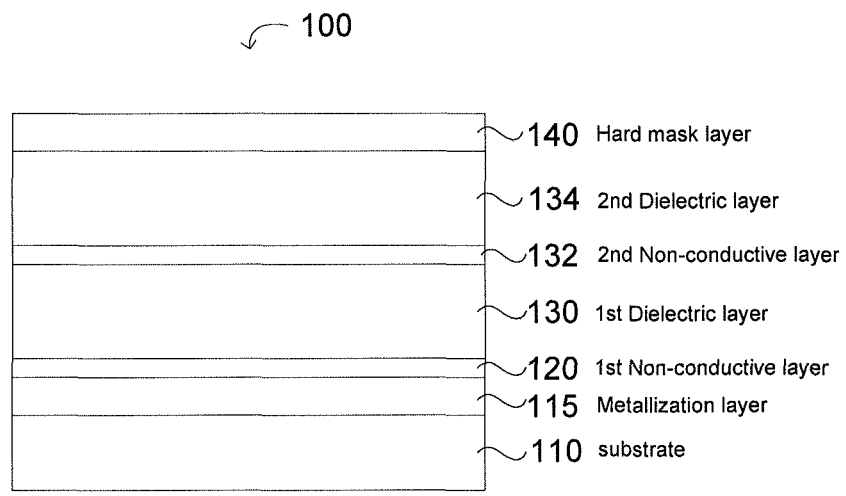
FIGS. 2-7 are diagrammatic cross-sectional side views of a portion of a semiconductor device at various stages of fabrication according to one embodiment of the present disclosure.

Referring to FIG. 2, a semiconductor device 100 is provided. The semiconductor device 100 may be an integrated circuit (IC) chip, system on chip (SOC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. The semiconductor device 100 includes a substrate 110. The substrate 110 may be a portion of a semiconductor wafer. For example, the substrate may include silicon. The substrate 110 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the substrate 110 includes various doped features for various microelectronic components, such as a complementary metal oxide semiconductor field-effect transistor (CMOSFET), imaging sensor, memory cell, and/or capacitive element.

In some embodiments, a metallization layer 115 is formed in a dielectric layer (not shown) on the substrate 110. The metallization layer 115 is a conductive layer and may be a first metal layer in the semiconductor device 100. In an embodiment, the metallization layer 115 includes a material containing copper.

According to an aspect of the present disclosure, a first non-conductive layer 120 is formed on the substrate 110. The first non-conductive layer 120 may be a barrier layer, and hence is alternatively referred to as first barrier layer 120. Alternatively, the first non-conductive layer 120 may be an etch stop layer. In damascene applications where the underlying layer is a low-k dielectric layer, the first barrier layer 120 is deposited to prevent diffusion of copper, aluminum or other metal into the underlying low-k dielectric layer(s). The barrier layer also serves as a nucleation layer on which the copper in an electroless bottom up fill process is grown. As the name implies, the first non-conductive layer 120 is non-conductive; however, in a later plasma treatment process, the first non-conductive layer 120 will be converted into a conductive layer for forming copper plugs in an electroless copper bottom up fill process.

In an embodiment, the first non-conductive layer 120 is a material selected from the group consisting of TaN, TaSiN, TaC, TiN, TiSiN, AlON, AlN, and AlO. Other suitable materials that are non-conductive may also be used. In an embodiment, the first non-conductive layer 120 is formed on the substrate 110 by a chemical vapor deposition (CVD) process. In another embodiment, the first non-conductive layer 120 is formed by an atomic layer deposition (ALD) process. Other suitable deposition processes may also be used. In an exemplary embodiment, the first non-conductive layer 120 has a thickness from about 10 angstroms and about 100 angstroms.

Still referring to FIG. 2, a first dielectric layer 130 is formed over the first non-conductive layer 120. The first dielectric layer 130 may be formed by suitable deposition processes such as, for example CVD, PVD, or spin-on coating. The first dielectric layer 130 includes a low-k material in an embodiment, for example, a compound made of a subset of the following elements: Si, O, C, and H. For example, the compound may be silicon oxide or silicon carbide. In an embodiment, the first dielectric layer 130 has a thickness that is less than about 1,000 angstroms.

A second non-conductive layer 132 is formed over the first low-k dielectric layer 130. The second non-conductive layer 132 may be a barrier layer, and hence is alternatively referred to as second barrier layer 132. Alternatively, the second non-conductive layer 132 may be an etch stop layer. In damascene applications where the underlying layer is a low-k dielectric layer, the second barrier layer 132 is deposited to prevent diffusion of copper, aluminum or other metal into the underlying low-k dielectric layer, such as first dielectric layer 130. As the name implies, the second non-conductive layer 132 is non-conductive; however, in a later plasma treatment process, the second non-conductive layer 132 will be converted into a conductive layer for forming copper plugs in an electroless copper bottom up fill process.

In an embodiment, the second non-conductive layer 132 is a material selected from the group consisting of TaN, TaSiN, TaC, TiN, TiSiN, AlON, AlN, and AlO. Other suitable materials that are non-conductive may also be used. In an embodiment, the second non-conductive layer 132 is formed on the first dielectric layer 130 by a chemical vapor deposition (CVD) process. In another embodiment, the second non-conductive layer 132 is formed by an atomic layer deposition (ALD) process. Other suitable deposition processes may also be used. In an exemplary embodiment, the second non-conductive layer 132 has a thickness from about 10 angstroms to about 100 angstroms.

Still referring to FIG. 2, a second dielectric layer 134 is formed over the second non-conductive layer 132. The second dielectric layer 134 may be formed by suitable processes such as, for example CVD, PVD, or spin-on coating processes. The second dielectric layer 134 includes a low-k material in an embodiment, for example, a compound made of a subset of the following elements: Si, O, C, and H. For example, the compound may be silicon oxide or silicon carbide. In an embodiment, the second dielectric layer 134 has a thickness that is less than about 1,000 angstroms.

A deposition process is performed to form a hard mask layer 140 over the second dielectric layer 134. In one embodiment, the hard mask layer 140 includes a photoresist material. In another embodiment, the hard mask layer 140 includes a dielectric material, for example silicon oxide, which can be patterned by a patterned photoresist layer. The hard mask layer 140 is used in a later process as an etching mask to form openings in the first dielectric layer 130 and the second dielectric layer 134.

Figure 3:
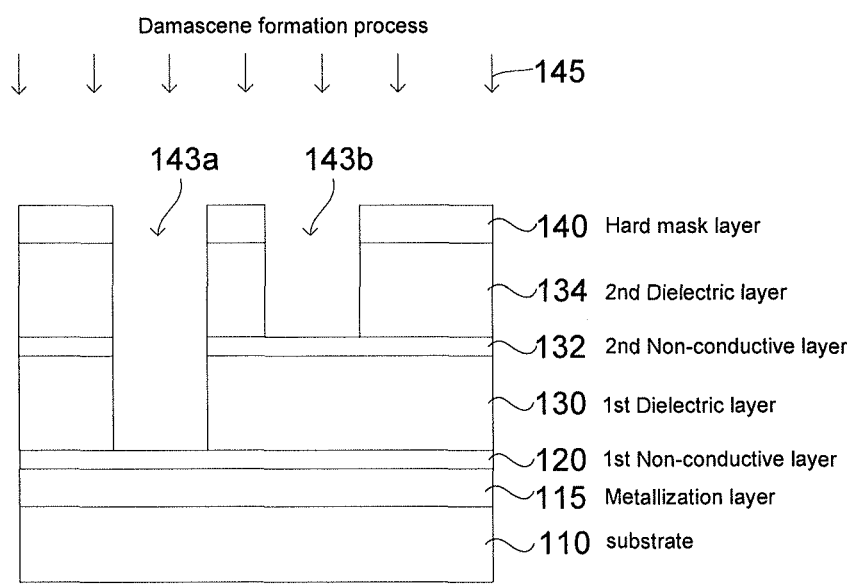

Referring now to FIG. 3, a damascene formation process 145 is performed on the semiconductor device 100 to form a plurality of openings in the hard mask layer 140, the second dielectric layer 134, the second non-conductive layer 132, and the first dielectric layer 130. In the embodiment shown in FIG. 3, a first opening 143a is formed in first dielectric layer 130 and second dielectric layer 134 and a second opening 143b is formed in second dielectric layer 134 but not in the first dielectric layer 130. In other embodiments, a single damascene opening may be formed. The damascene formation process 145 may include using a process such as photolithography, immersion lithography, ion-beam writing, or other suitable processes. For example, the photolithography process may include spin-coating, soft baking, exposure, post-baking, developing, rinsing, drying, and other suitable processes. The damascene formation process 145 includes an etching process in which the patterned hard mask layer 140 is used as a mask to etch the openings in the dielectric layers. For example, both the second dielectric layer 134 and the first dielectric layer 130 are etched, with the etching stopping at the first non-conductive layer 120 to form first opening 143a, and the second dielectric layer 134 is etched, the etching stopping at the second non-conductive layer 132 to form second opening 143b.

For the sake of simplicity, only first opening 143a and second opening 143b are illustrated herein, though it is understood that many other openings may be formed. Each of the openings 143a and 143b is approximately aligned (vertically) with a respective one of a portion of the metallization layer 115. Those skilled in the art will recognize that although metallization layer 115 is shown as a continuous layer for simplicity, in actual practice, metallization layer 115 will be patterned into numerous individual regions.

Figure 4:
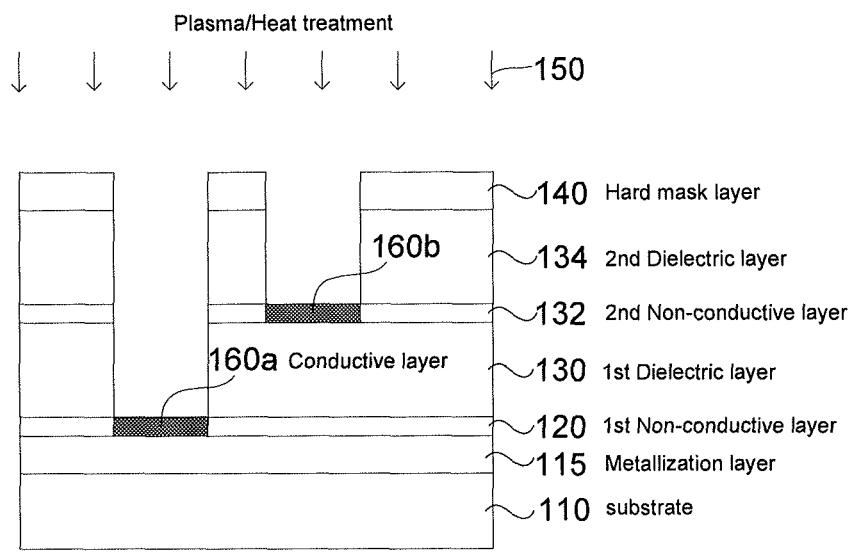

With reference to FIG. 4, a plasma/heat treatment 150 is performed on the semiconductor device 100 to convert the first non-conductive layer 120 within the first opening 143a into a first conductive layer 160a, and to convert the second non-conductive layer 132 within the second opening 143b into a second conductive layer 160b. The heat of the plasma converts the TaN in the first and second non-conductive layers 120 and 132, respectively from a non-conductive N rich layer to a conductive Ta rich layer. In an exemplary embodiment, the heat treatment is performed with a plasma gas selected from the group consisting of Ar, H2, He, Ne or mixtures thereof. In one embodiment, the heat treatment is performed at a temperature ranging between about 20 Celsius and about 400 Celsius, at a pressure ranging between about 0.01 torr and about 100 torr at a power ranging between about 50 watts and about 500 watts, and a time of between 3 seconds and 30 seconds. Those skilled in the art will recognize that the first non-conductive layer 120 can be converted into first conductive layer 160 by other heat treatments, such as for example, rapid anneal and pulsed beam (e.g., laser).

Figure 5:
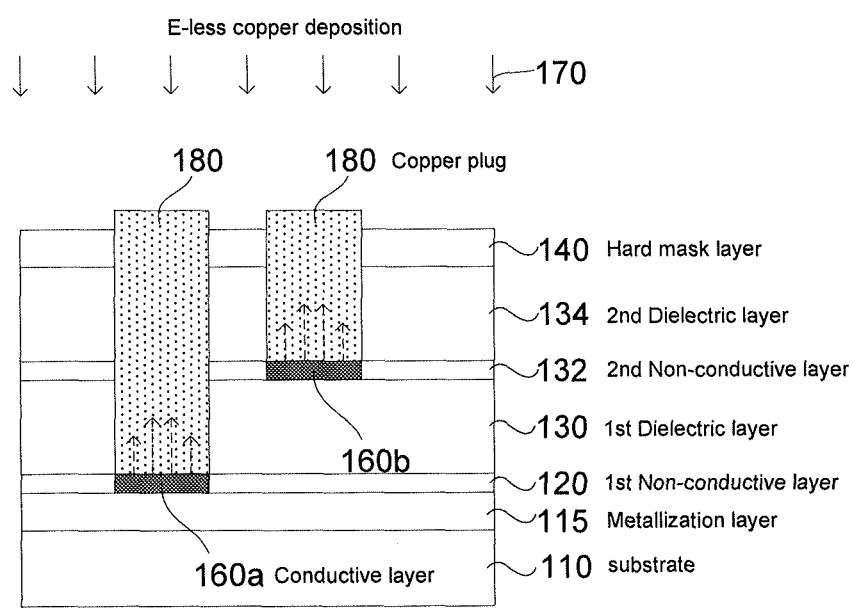

With reference to FIG. 5, a damascene deposition process 170 is performed on the semiconductor device 100. The damascene deposition process 170 deposits a conductive material in openings 143a and 143b. In one embodiment, the damascene deposition process 170 includes an electroless copper bottom-up fill process. With conventional copper deposition processes, the top portion of the opening may be blocked, thereby creating a void underneath the opening that may degrade the performance of the semiconductor device. In an electroless copper bottom up fill process, the void is avoided.

Figure 6:
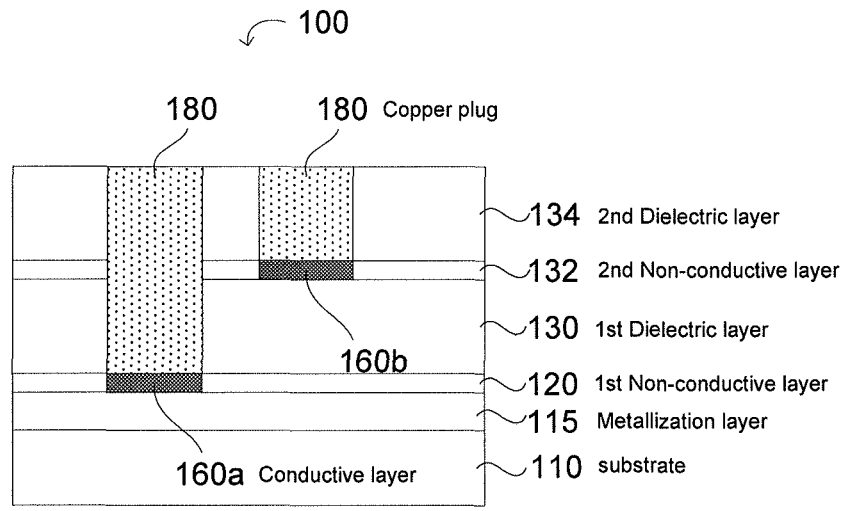

In the electroless copper bottom-up fill process, the process includes contacting first opening 143a and second opening 143b with an electroless plating bath and allowing electroless deposition of a conductive material to proceed for a predetermined time. One skilled in the art understands the composition of the electroless plating bath for copper filling and that it may include, for example a reducing agent, a surfactant, and a source of copper ions. In one embodiment, the electroless plating bath includes metal sources, reducing agents, buffer agents, and additives and the conductive material includes one of CuMn, CuCr, CuV, CuTi, and/or CuNb. According to one embodiment, the openings 143a and 143b are subject to the electroless plating bath for a period from about 100 seconds to about 5,000 seconds. Thereafter, the substrate is removed from the electroless plating bath. The process of contacting the openings to the electroless plating bath and removing the substrate therefrom is repeated to at least partially fill the openings 143a and 143b with a conductive material. As a result of the damascene deposition process 170, copper-containing plugs 180 are formed in the openings 143a and 143b. A planarization step using, for example a chemical mechanical polishing (CMP) process is subsequently performed after the damascene deposition process 170 to planarize the copper-containing plugs 180 so that the top thereof is co-planar with the top of the second low-k dielectric layer 134. The semiconductor device 100 after the step of planarization is shown in FIG. 6.

Figure 7:
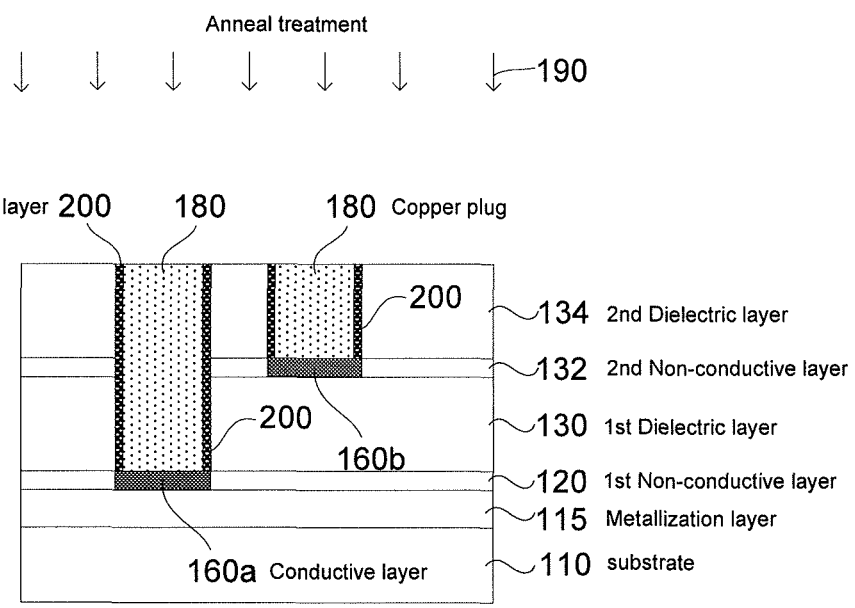

FIG. 7 shows a self-forming barrier layer 200 formed on the sidewalls of the copper-containing plugs 180. The self-forming barrier layer 200 includes metals and is electrically conductive but does not permit inter-diffusion and reactions between the copper-containing plugs 180 and the surrounding dielectric layer, such as first dielectric layer 130 and second dielectric layer 134. In one embodiment, an anneal treatment 190 is applied to the substrate to form a self-forming barrier layer 200 wrapping around the copper-containing plugs 180. The anneal treatment may be a rapid thermal anneal (RTA), a laser anneal, and/or a flash lamp anneal. In one embodiment, the barrier layer 200 is self-formed by applying a temperature from about 200 C to about 400 C to the substrate 110 for a time period of about 1 minute. The anneal process may be conducted in an oxygen ambient, a combination of steam ambient and oxygen ambient combined, or under an inert gas atmosphere. In one embodiment where the alloy element in the copper plug 180 manganese (Mn), with the thermal driving force, Mn segregates from copper and is driven to about the surfaces of the copper plug 180 where Mn reacts with oxygen to form manganese oxide (MnOx). In other embodiments, the barrier layer 200 may include CrOx, VOx, TiOx, and/or NbOx; however, the composition depends on the type of copper alloy used in the copper plug 180.

Figure 8:
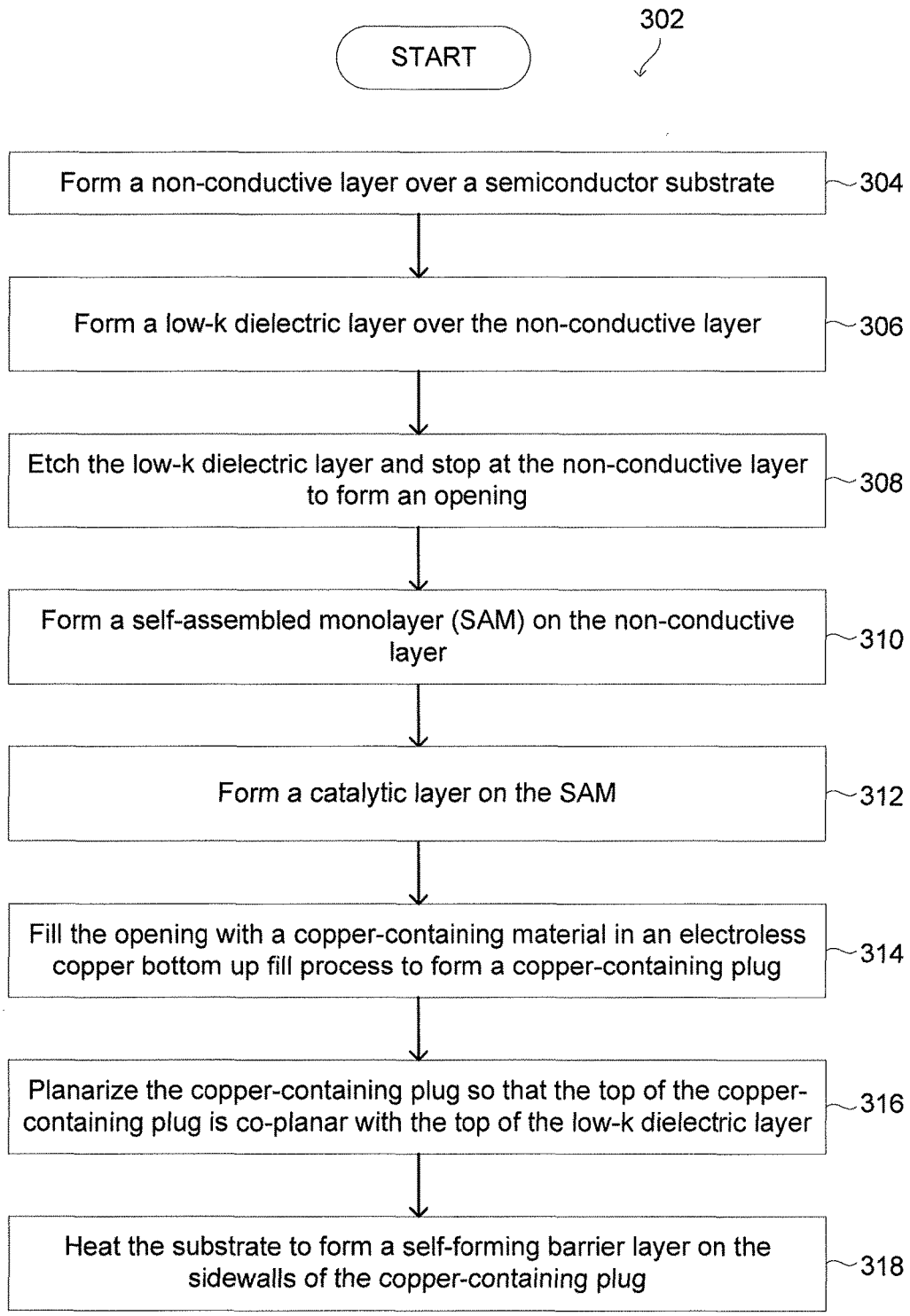
FIG. 8 is a flowchart of a method of fabricating a semiconductor device according to one embodiment of the present disclosure.

FIG. 8 is a flowchart of a method 302 of fabricating a semiconductor device according to another embodiment of the present disclosure. Referring to FIG. 8, the method 302 includes block 304, in which a non-conductive layer is formed over a semiconductor substrate. The method 302 includes block 306, in which a low-k dielectric layer is formed over the non-conductive layer. The method 302 includes block 308, in which the low-k dielectric layer is etched the etching stopping at the non-conductive layer to form an opening. The method 302 includes block 310, in which a self-assembled monolayer (SAM) is formed on the non-conductive layer. The method 302 includes block 312, in which a catalytic layer is formed on the SAM. The method 302 includes block 314, in which the opening is filled with a copper-containing material in an electroless copper bottom fill process to form a copper-containing plug. The method 302 includes block 316, in which the copper containing plug is planarized so that the top of the copper containing plug is co-planar with the top of the low-k dielectric layer. The method 302 includes block 318, in which the substrate is heated to form a self-forming barrier layer on the sidewalls of the copper containing plug.

Figure 9:
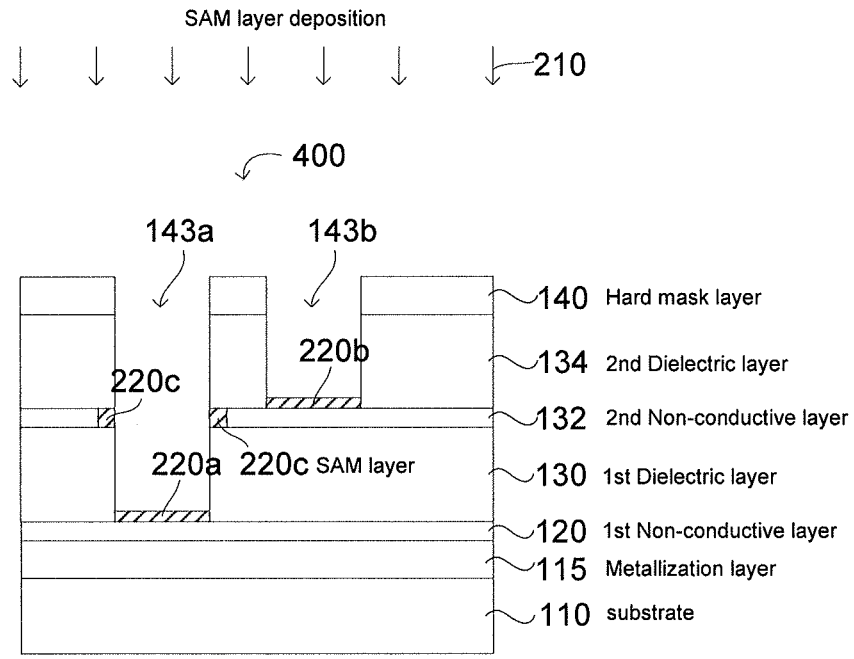
FIGS. 9-13 are diagrammatic cross-sectional side views of a portion of a semiconductor device at various stages of fabrication according to another embodiment of the present disclosure.

FIGS. 9-13 are diagrammatic cross-sectional side views of a portion of a semiconductor device at various stages of fabrication according to one embodiment of the method 302 of FIG. 8. FIG. 9 shows the semiconductor device 400 (similar to the semiconductor device 100 in FIG. 3 but with the addition of a self assembled monolayer (SAM) deposited in first opening 143a and second opening 143b). Specifically, a SAM layer 220a is deposited on the first non-conductive layer 120 within the first opening 143a; a SAM layer 220b is deposited on the second non-conductive layer 132 within the second opening 143b; and SAM layers 220c are deposited on the second non-conductive layer 132 within the first opening 143a. The SAM is a short carbon chain structure. In an exemplary embodiment, the SAM structure has around 2 to 10 units carbon and two different functional groups on two sides. One side has, as an example a Si—OH functional group that bonds with the non-conductive layers 120 and 132, and the other side has, as an example a —NH2 functional group that bonds with catalytic layer elements such as Co, Pd, Ru, and Ni found in later formed catalytic layers 240a, 240b, and 240c (see FIG. 10). The SAM may be deposited via spin-on coating from a solution containing solvents such as, for example hexane and SAM monomer.

Figure 10:
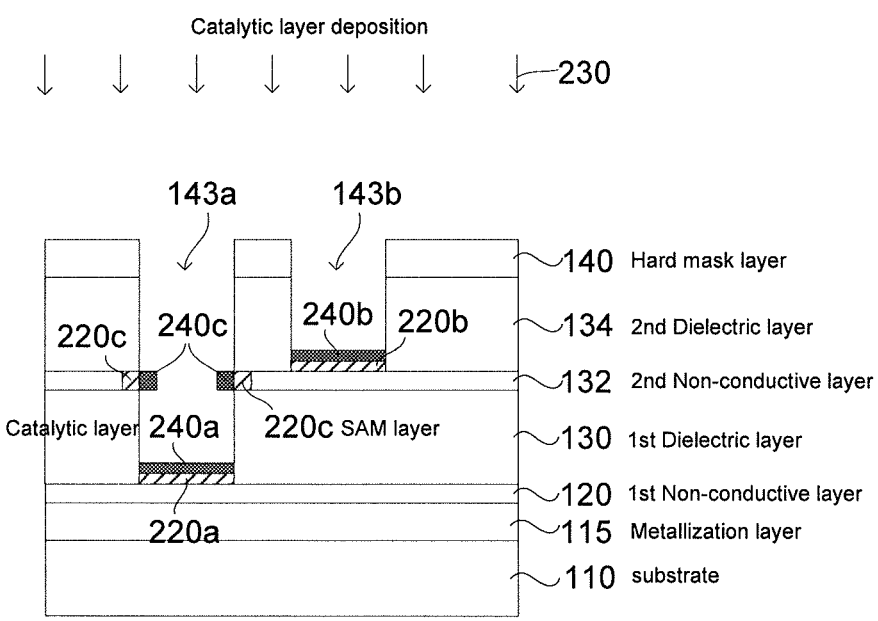

Referring now to FIG. 10, a catalytic layer deposition 230 is performed on the semiconductor device 400. A catalytic layer is deposited on the surfaces of the SAM. In the embodiment shown in FIG. 10, a catalytic layer 240a is deposited on SAM layer 220a; a catalytic layer 240b is deposited on SAM layer 220b; and catalytic layers 240c are deposited on SAM layers 220c. The catalytic layers 240a,

240b, and 240c include a material selected from the group consisting of Co, Pd, Ru, Ni, and combinations thereof and are formed over the respective ones of the SAM by chemical bonding, for example.

Figure 11:
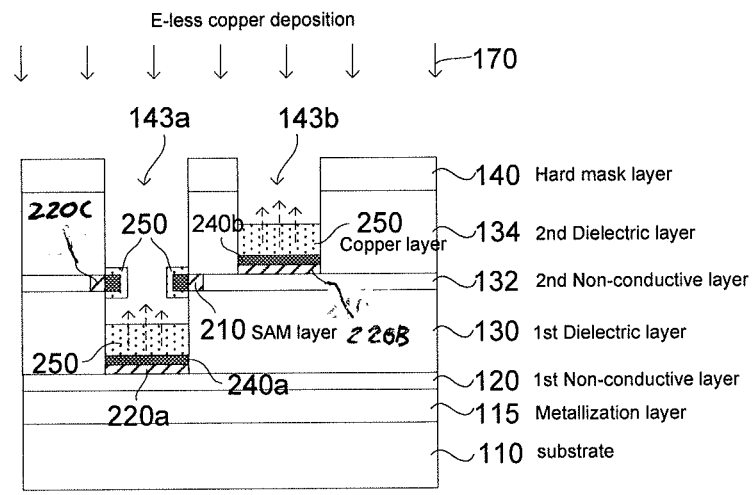

With reference to FIG. 11, a damascene deposition process 170 is performed on the semiconductor device 400. The damascene deposition process 170 deposits a conductive material on the catalytic layers 240a, 240b, and 240c in openings 143a and 143b. In one embodiment, the damascene deposition process 170 includes an electroless copper bottom-up fill process. With conventional copper deposition processes, the top portion of the opening may be blocked, thereby creating a void underneath the opening that may degrade the performance of the semiconductor device. In an electroless copper bottom up fill process, the void is avoided.

Figure 12:
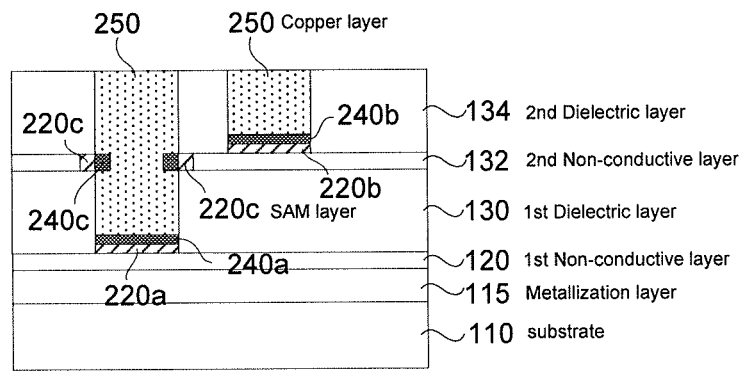

In the electroless copper bottom-up fill process, the process includes contacting first opening 143a and second opening 143b with an electroless plating bath and allowing electroless deposition of a conductive material on the catalytic layers to proceed for a predetermined time. One skilled in the art understands the composition of the electroless plating bath for copper filling and that it may include, for example a reducing agent, a surfactant, and a source of copper ions. In one embodiment, the electroless plating bath includes metal sources, reducing agents, complex agents, buffer agents, additives and the conductive material includes one of CuMn, CuCr, CuV, CuTi, and/or CuNb. According to one embodiment, the openings 143a and 143b are subject to the electroless plating bath for a period from about 10 seconds to about 500 seconds. Thereafter, the substrate is removed from the electroless plating bath. The process of contacting the openings to the electroless plating bath and removing the substrate therefrom is repeated to at least partially fill the openings 143a and 143b with a conductive material. As a result of the damascene deposition process 170, copper-containing plugs 250 are formed in the openings 143a and 143b. A planarization step using, for example a chemical mechanical polishing (CMP) process is subsequently performed after the damascene deposition process 170 to planarize the copper-containing plugs 250 so that the top thereof is co-planar with the top of the second low-k dielectric layer 134. The semiconductor device 400 after the step of planarization is shown in FIG. 12.

Figure 13:
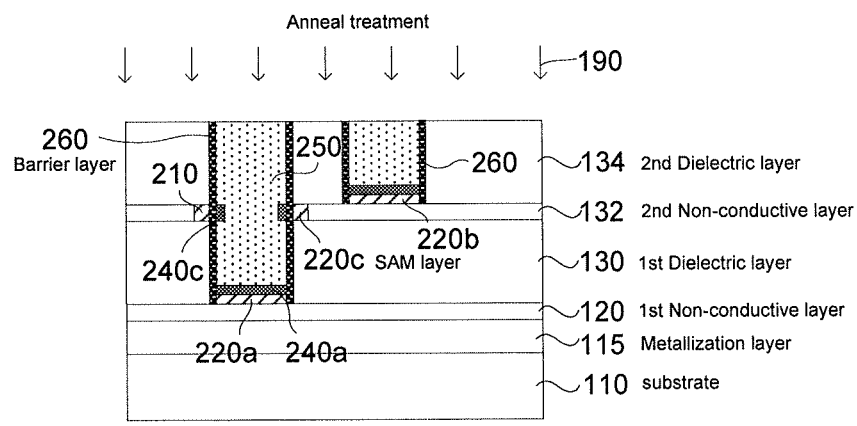

FIG. 13 shows a self-forming barrier layer 260 formed on the sidewalls of the copper-containing plugs 250. The self-forming barrier layer 260 includes metals and is electrically conductive but does not permit inter-diffusion and reactions between the copper-containing plugs 250 and the surrounding dielectric layer, such as first dielectric layer 130 and second dielectric layer 134. In one embodiment, an anneal treatment 190 is applied to the substrate to form a self-forming barrier 260 wrapping over the copper-containing plugs 250. The anneal treatment may be a rapid thermal anneal (RTA), a laser anneal, and/or a flash lamp anneal. The anneal process may be conducted in an oxygen ambient, a combination of steam ambient and oxygen ambient combined, or under an inert gas atmosphere.

The semiconductor devices with copper damascene shown in FIGS. 2-7 and 9-13 are only for illustrative purpose and are not limiting. Additional embodiments can be conceived.

The present disclosure has described various exemplary embodiments. According to one embodiment, a method of fabricating a semiconductor device includes forming a non-conductive layer over a semiconductor substrate. A low-k dielectric layer is formed over the non-conductive layer. The low-k dielectric layer is etched and stopped at the non-conductive layer to form an opening. A plasma treatment is performed on the substrate to convert the non-conductive layer within the opening into a conductive layer. The opening is filled with a copper-containing material in an electroless copper bottom up fill process to form a copper-containing plug. The copper-containing plug is planarized so that the top of the copper-containing plug is co-planar with the top of the low-k dielectric layer. The substrate is heated to form a self-forming barrier layer on the sidewalls of the copper-containing plug.

According to another embodiment, a method of fabricating a semiconductor device includes forming a non-conductive layer over a semiconductor substrate. A low-k dielectric layer is formed over the non-conductive layer. The low-k dielectric layer is etched and stopped at the non-conductive layer to form an opening. A self-assembled monolayer (SAM) is formed on the non-conductive layer. A catalytic layer is formed on the SAM. The opening is filled with a copper-containing material in an electroless copper bottom up fill process to form a copper-containing plug. The copper-containing plug is planarized so that the top of the copper-containing plug is co-planar with the top of the low-k dielectric layer. The substrate is heated to form a self-forming barrier layer on the sidewalls of the copper-containing plug.

According to yet another embodiment, a method of fabricating a damascene layer includes forming a first non-conductive layer over a semiconductor substrate. A first low-k dielectric layer is formed over the first non-conductive layer. A second non-conductive layer is formed over the first low-k dielectric layer. A second low-k dielectric layer is formed over the second non-conductive layer. The first low-k dielectric layer is etched and stopped at the first non-conductive layer to form a first opening and the second low-k dielectric layer is etched and stopped at the second non-conductive layer to form a second opening. A plasma treatment is performed on the substrate to convert the first non-conductive layer within the first opening into a first conductive layer and the second non-conductive layer within the second opening into a second conductive layer. The first and second openings are filled with a copper-containing material in an electroless copper bottom up fill process to form a first copper-containing plug and a second copper-containing plug, respectively. The first and second copper-containing plugs are planarized so that the tops of the plugs are co-planar with the top of the second low-k dielectric layer. The substrate is heated to form a self-forming barrier layer on the sidewalls of the first and second copper-containing plugs.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:
1. A method comprising:
   forming an opening in a dielectric layer, the opening exposing a non-conductive layer disposed over a semiconductor substrate;

forming a self-assembled monolayer (SAM) within the opening and over the non-conductive layer, wherein a first side of the SAM facing the non-conductive layer has a first functional group, and a second side of the SAM opposing the first side has a second functional group different from the first functional group;

forming a catalytic layer within the opening and over the SAM, wherein the first functional group of the SAM bonds with the non-conductive layer, and the second functional group of the SAM bonds with the catalytic layer;

filling the opening having the SAM and the catalytic layer with a conductive material to form a plug after the forming of the opening; and heating the semiconductor substrate to form a barrier layer on sidewalls of the plug after the filling of the opening.

2. The method of claim 1, wherein the filling the opening comprises an electroless copper bottom up fill process.

3. The method of claim 1, wherein the catalytic layer comprises a material selected from the group consisting of Co, Pd, Ru, Ni, and combinations thereof.

4. The method of claim 1, wherein the heating the semiconductor substrate comprises an anneal process conducted in an oxygen ambient, a combination of steam ambient and oxygen ambient, or under an inert gas atmosphere.

5. A method of forming a device comprising:
etching a first opening to expose a first non-conductive layer, the first opening extending through a first low-k dielectric layer, a second non-conductive layer disposed over the first low-k dielectric layer, and a second low-k dielectric layer disposed over the second non-conductive layer;

etching a second opening to expose the second non-conductive layer, the second opening extending through the second low-k dielectric layer;

coating a first self-assembled monolayer (SAM) layer and a second SAM layer over the exposed first non-conductive layer and the exposed second non-conductive layer, respectively;

depositing a first catalytic layer and a second catalytic layer over the first SAM layer and the second SAM layer, respectively;

filling the first opening and the second opening with a conductive material to form a first plug and a second plug, respectively; and heating the device to form self-forming barrier layers on sidewalls of the first plug and the second plug.

6. The method of claim 5, wherein the heating the device comprises an anneal process.

7. The method of claim 6, wherein the anneal process comprises at least one of a rapid thermal anneal, a laser anneal, or a flash lamp anneal.

8. The method of claim 5, wherein the filling the first opening and the second opening comprises an electroless copper bottom up fill process.

9. The method of claim 5, wherein the etching the first opening and the etching the second opening comprises a damascene formation process.

10. The method of claim 5, wherein each of the first catalytic layer and the second catalytic layer comprises a material selected from the group consisting of Co, Pd, Ru, Ni, and combinations thereof.

11. The method of claim 5, wherein the coating the first SAM layer and the second SAM layer comprises a spin-on coating process.

12. The method of claim 5, wherein each of the first SAM layer and the second SAM layer comprises a short carbon chain structure.

13. A method comprising:
forming an etch stop layer over a semiconductor substrate, and a low-k dielectric layer over the etch stop layer;

etching an opening through the low-k dielectric layer, the opening exposing a surface of the etch stop layer;

lining the exposed surface of the etch stop layer with a short carbon chain structure;

lining a surface of the short carbon chain structure with a catalytic layer;

filling the opening with conductive material using a bottom-up fill process, the conductive material being an alloy comprising a first metal and a second metal, the conductive material disposed over the short carbon chain structure and the catalytic layer, and extending to an upper surface of the low-k dielectric layer distal the semiconductor substrate; and after the filling, performing an anneal process, wherein the anneal process segregates the first metal from the second metal, and forms a barrier layer comprising an oxide of the first metal on sidewalls of the conductive material within the opening.

14. The method of claim 13, wherein the bottom-up fill process comprises an electroless copper bottom-up fill process.

15. The method of claim 13, wherein the anneal process comprises a rapid thermal anneal, a laser anneal, or a flash lamp anneal.

16. The method of claim 13, wherein the etch stop layer is a non-conductive layer and the catalytic layer is a conductive layer, and wherein the short carbon chain structure has a first functional group on a first side thereof that bonds with the etch stop layer, and a second functional group on a second side thereof opposing the first side that bonds with the catalytic layer.

17. The method of claim 13, wherein the second metal is copper, and the first metal comprises a material selected from the group consisting of Mn, Cr, V, Ti, Nb, and combinations thereof.

18. The method of claim 17, wherein the performing the anneal process drives the segregated first metal to exterior surfaces of the conductive material.

19. The method of claim 1, wherein the first functional group comprises a Si—OH functional group, and the second functional group comprises a —NH$_2$ functional group.

20. The method of claim 1, wherein the barrier layer is a self-forming barrier on sidewalls of the plug.

* * * * *